US010679782B2

(12) United States Patent
Manipatruni et al.

(10) Patent No.: US 10,679,782 B2
(45) Date of Patent: Jun. 9, 2020

(54) SPIN LOGIC WITH SPIN HALL ELECTRODES AND CHARGE INTERCONNECTS

(71) Applicant: Intel Corporation, Santa Clara, CA (US)

(72) Inventors: Sasikanth Manipatruni, Hillsboro, OR (US); Dmitri E. Nikonov, Beaverton, OR (US); Anurag Chaudhry, Sunnyvale, CA (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/751,111

(22) PCT Filed: Sep. 9, 2015

(86) PCT No.: PCT/US2015/049223
§ 371 (c)(1),
(2) Date: Feb. 7, 2018

(87) PCT Pub. No.: WO2017/044095
PCT Pub. Date: Mar. 16, 2017

(65) Prior Publication Data
US 2018/0240583 A1    Aug. 23, 2018

(51) Int. Cl.
*G11C 11/16*       (2006.01)
*G11C 11/18*       (2006.01)
(Continued)

(52) U.S. Cl.
CPC ........ *H01F 10/3254* (2013.01); *G11C 11/161* (2013.01); *G11C 11/1675* (2013.01);
(Continued)

(58) Field of Classification Search
CPC ....... H01L 43/04; H01L 43/065; H01L 43/06; H03K 19/18; G11C 11/16
See application file for complete search history.

(56) References Cited

U.S. PATENT DOCUMENTS 8,963,579 B2    2/2015    Nikonov et al.
9,166,144 B2   10/2015    Oh et al.
(Continued)

FOREIGN PATENT DOCUMENTS

TW    201419598    5/2014
TW    201447881   12/2014

OTHER PUBLICATIONS

International Search Report and Written Opinion for PCT/US15/49223 dated Jun. 8, 2016, 10 pages.
(Continued)

*Primary Examiner* — Nduka E Ojeh
(74) *Attorney, Agent, or Firm* — Green, Howard & Mughal LLP

(57) ABSTRACT

Described is an apparatus which comprises: an input ferromagnet to receive a first charge current and to produce a first spin current; a first layer configured to convert the first spin current to a second charge current via spin orbit coupling (SOC), wherein at least a part of the first layer is coupled to the input ferromagnet; and a second layer configured to convert the second charge current to a second spin current via spin orbit coupling (SOC).

18 Claims, 9 Drawing Sheets

(51) Int. Cl.
  *H01L 43/00* (2006.01)
  *H01L 43/02* (2006.01)
  *H01L 43/08* (2006.01)
  *H01L 43/10* (2006.01)
  *H01L 43/12* (2006.01)
  *H01F 10/32* (2006.01)
  *H03K 19/18* (2006.01)
  *H03K 19/23* (2006.01)
  *H01F 41/32* (2006.01)
  *H01L 27/22* (2006.01)

(52) U.S. Cl.
  CPC ............ *G11C 11/18* (2013.01); *H01F 10/329* (2013.01); *H01F 10/3272* (2013.01); *H01F 10/3286* (2013.01); *H01F 41/32* (2013.01); *H01L 43/00* (2013.01); *H01L 43/02* (2013.01); *H01L 43/08* (2013.01); *H01L 43/10* (2013.01); *H01L 43/12* (2013.01); *H03K 19/18* (2013.01); *H03K 19/23* (2013.01); *H01L 27/228* (2013.01)

(56) References Cited

U.S. PATENT DOCUMENTS

| | | |
|---|---|---|
| 2013/0141966 A1 | 6/2013 | Ohno et al. |
| 2014/0091411 A1* | 4/2014 | Manipatruni ............ H01L 27/22 257/421 |
| 2014/0139265 A1* | 5/2014 | Manipatruni ............ H03K 19/16 326/101 |
| 2014/0231888 A1 | 8/2014 | Kelber et al. |
| 2014/0264671 A1 | 9/2014 | Chepulskyy et al. |
| 2015/0041934 A1 | 2/2015 | Khvalkovskiy |
| 2017/0243917 A1* | 8/2017 | Manipatruni ............ H01L 27/22 |

OTHER PUBLICATIONS

International Preliminary Report on Patentability for International Patent Application No. PCT/US15/49223 dated Mar. 22, 2018.

OASR dated Sep. 12, 2019 for Taiwan Patent Application No. 105124239, 6 pgs.

* cited by examiner

US 10,679,782 B2

SPIN LOGIC WITH SPIN HALL ELECTRODES AND CHARGE INTERCONNECTS

CLAIM OF PRIORITY

This Application is a National Stage Entry of, and claims priority to, PCT Application No. PCT/US15/49223, filed on 9 Sep. 2015 and titled "SPIN LOGIC WITH SPIN HALL ELECTRODES AND CHARGE INTERCONNECTS," which is incorporated by reference in its entirety for all purposes.

BACKGROUND

Detecting a state of a magnet is a basic computation step for magnetic memory and magnetic logic devices. The state of the magnet determines whether it is storing a logic zero or logic one. An example of a magnetic memory is Spin Transfer Torque (STT) Magnetic Random Access Memory (MRAM). In STT MRAM, the state of the magnetic memory is determined by sensing a resistance of a magnetic device of the memory, and then comparing that resistance against a reference resistance. Conversion of the magnetic state to a charge variable is also important for magnetic spin logic and interconnects. For example, a charge variable such as current can flow through long interconnects to other magnetic spin logic. Existing magnet detection is based on magnetic tunnel junctions (MTJs) and/or spin current interconnects which suffer from several limitations, however.

For example, conversion from spin current to charge variable mediated by Tunneling Magneto Resistance (TMR) has limited conversion efficiency, TMR based readout from a memory limits the device resistance to a range of 4 k to 8 K Ohms, and spin current based interconnects are limited in interconnect length due to spin degradation along the length of the interconnect. These limitations and constraints result in inefficient switching, limited read speeds of the STT MRAM, and limited interconnect options for spin logic.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
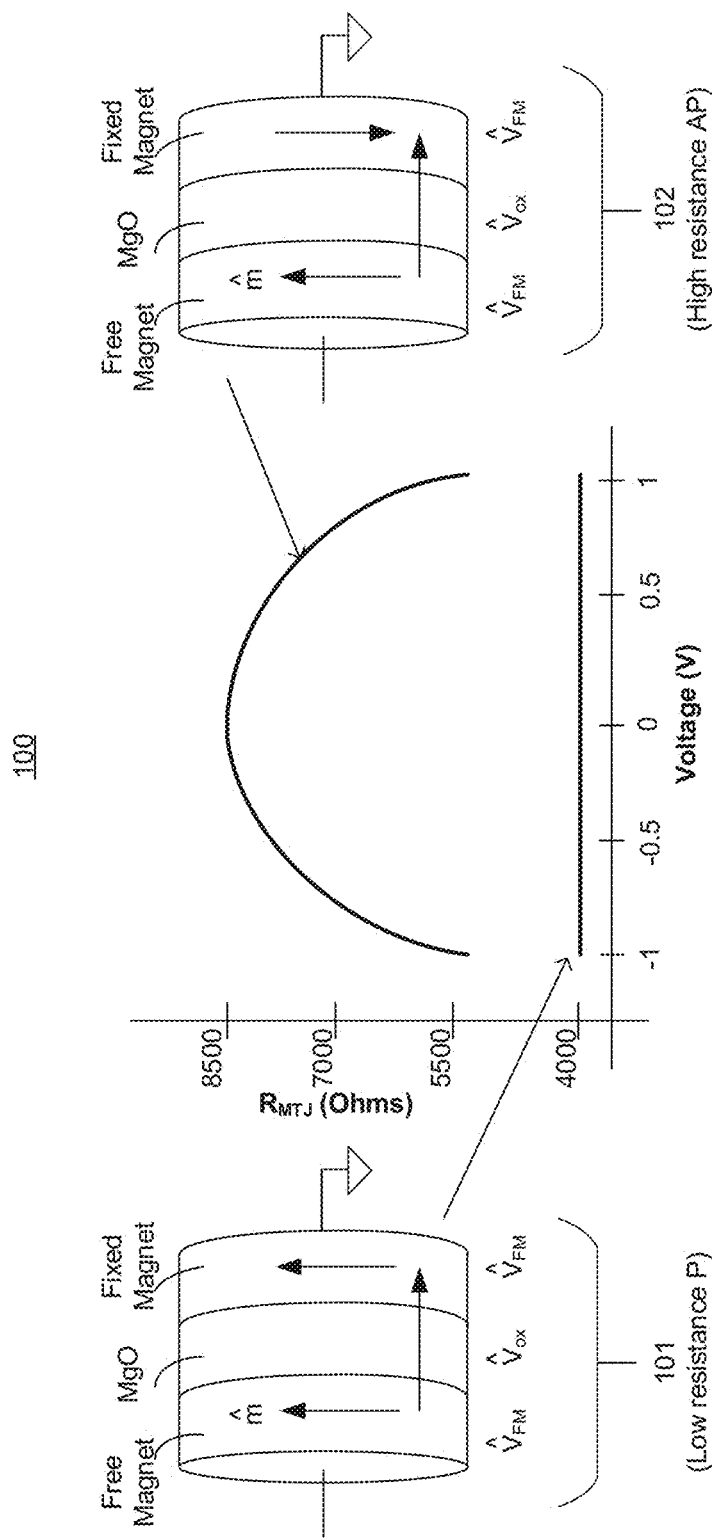
FIG. 1A illustrates a Magnetic Tunneling Junction (MTJ) with typical Tunnel Magneto Resistance (TMR) based readout of the MTJ.

Tunnel Magneto Resistance (TMR) based spin-to-charge variable conversion has limited conversion efficiency. FIG. 1A illustrates a typical TMR based readout of a Magnetic Tunneling Junction (MTJ) 100. In one example, MTJ 101/102 comprises stacking a ferromagnetic layer (e.g., Free Magnet) with a tunneling dielectric (e.g., MgO) and another ferromagnetic layer (Fixed Magnet). The plot in the center illustrates the dependence of resistance ($R_{MTJ}$) on voltage across MTJ 101/102 for the two magnetization directions of the Free Magnet relative to the Fixed Magnet, where resistance is in Ohms and voltage in Volts. Here, MTJ 101 illustrates the low resistance state where the magnetization of the Free Magnet is in the same direction as the magnetization of the Fixed Magnet (i.e., the directions of magnetizations are parallel (P) to each other). MTJ 102 illustrates the high resistance state where the direction of magnetization of the Free Magnet is in the opposite direction as the direction of magnetization of the Fixed Magnet (i.e., the directions of magnetizations are anti-parallel (AP) to each other).

Here, the read out of the magnetization is obtained via sensing of a resistance change across MTJ 101/102 on the order of 4 k Ohms (which translates to a voltage of 40 mV to 80 mV at 10 μA read current). In this example, 10 μA of read current limits the total read time to 5 ns to 10 ns, which is slow. As such, the TMR based read out of MTJs 101/102 is highly limited in the signal strength and speed it can generate.

Figure 1B:
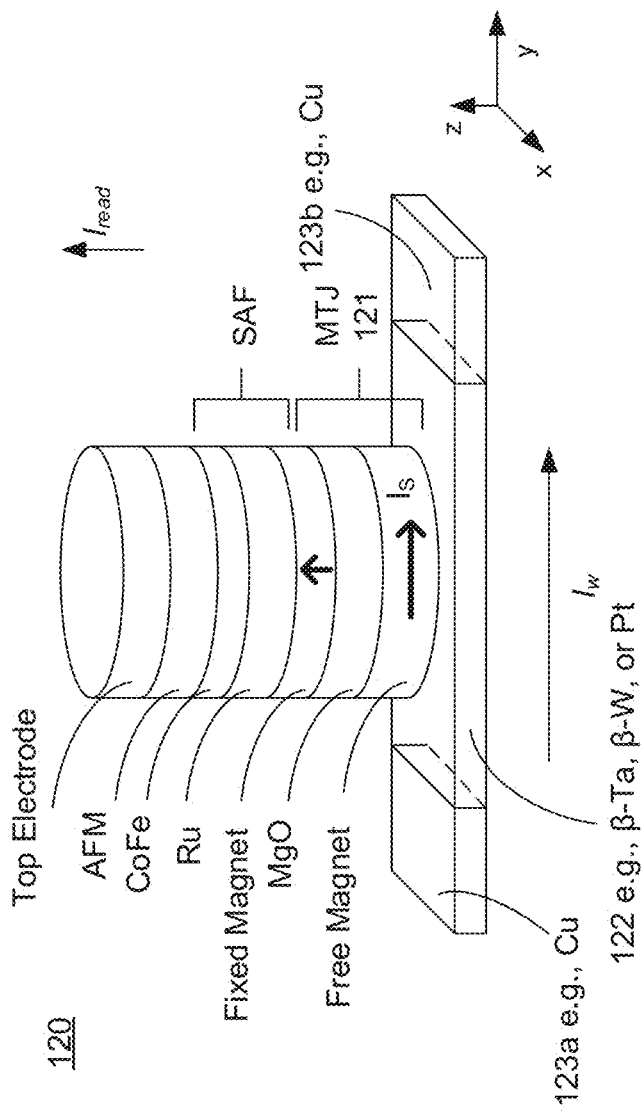
FIG. 1B illustrates a stack of layers having a MTJ coupled to an electrode formed of Spin Hall Effect (SHE) material, where the SHE material converts charge current to spin current.

FIG. 1B illustrates stack of layers 120 having a MTJ coupled to an electrode formed of Spin Hall Effect (SHE) material, where the SHE material converts charge current $I_W$ (or write current) to spin current $I_S$. Stack 120 forms a three terminal memory cell with SHE induced write mechanism and MTJ based read-out. Stack 120 comprises MTJ 121, SHE Interconnect or electrode 122, and non-magnetic metal(s) 123a/b. In one example, MTJ 121 comprises stacked ferromagnetic layer with a tunneling dielectric and another ferromagnetic layer. One or both ends along the horizontal direction of SHE Interconnect 122 is formed of non-magnetic metals 123a/b.

A wide combination of materials can be used for material stacking of MTJ 121. For example, the stack of materials include: $Co_xFe_yB_z$, MgO, $Co_xFe_yB_z$, Ru, $Co_xFe_yB_z$, IrMn, Ru, Ta, and Ru, where 'x,' 'y,' and 'z' are fractions of elements in the alloys. Other materials may also be used to form MTJ 121. MTJ 121 stack comprises free magnetic layer, MgO tunneling oxide, a fixed magnetic layer which is a combination of CoFe/Ru/CoFe layers referred to as Synthetic Anti-Ferromagnet (SAF)—based, and an Anti-Ferromagnet (AFM) layer. The SAF layer has the property, that the magnetizations in the two CoFe layers are opposite, and allows for cancelling the dipole fields around the free magnetic layer such that a stray dipole field will not control the free magnetic layer.

SHE Interconnect 122 (or the write electrode) is made of one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. SHE Interconnect 122 transitions into high conductivity non-magnetic metal(s) 123a/b to reduce the resistance of SHE Interconnect 122. The non-magnetic metal(s) 123a/b are formed from one or more of: Cu, Co, α-Ta, Al, CuSi, or NiSi.

In one case, the magnetization direction of the fixed magnetic layer is perpendicular relative to the magnetization direction of the free magnetic layer (i.e., magnetization directions of the free and fixed magnetic layers are not parallel, rather they are orthogonal). For example, the magnetization direction of the free magnetic layer is in-plane while the magnetization direction of the fixed magnetic layer is perpendicular to the in-plane. In another case, the magnetization direction of the fixed magnetic layer is in-plane while the magnetization direction of the free magnetic layer is perpendicular to the in-plane.

The thickness of a ferromagnetic layer (i.e., fixed or free magnetic layer) may determine its magnetization direction. For example, when the thickness of the ferromagnetic layer is above a certain threshold (depending on the material of the magnet, e.g. approximately 1.5 nm for CoFe), then the ferromagnetic layer exhibits magnetization direction which is in-plane. Likewise, when the thickness of the ferromagnetic layer is below a certain threshold (depending on the material of the magnet), then the ferromagnetic layer exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

In this example, the applied current $I_w$ is converted into spin current $I_s$ by SHE Interconnect 122. This spin current switches the direction of magnetization of the free layer and thus changes the resistance of MTJ 121. However, to read out the state of MTJ 121, a sensing mechanism is needed to sense the resistance change. In the case of FIG. 1A, this resistance change can be significantly higher than 4 k Ohms and therefore is easier to sense.

The magnetic cell is written by applying a charge current via SHE Interconnect 122. The direction of the magnetic writing (in the free magnet layer) is decided by the direction of the applied charge current. Positive currents (i.e., currents flowing in the +y direction) produce a spin injection current with transport direction (along the +z direction) and spins pointing to the +x direction. The injected spin current in-turn produces spin torque to align the free magnet (coupled to the SHE material) in the +x or −x direction. The injected spin current $\vec{I}_s$ generated by a charge current $\vec{I}_c$ in the write electrode is given by:

$$\vec{I}_s = P_{SHE}(w,t,\lambda_{sf},\theta_{SHE})(\hat{z} \times \vec{I}_c) \quad (1)$$

where, the vector of spin current $\vec{I}_s = \vec{I}_\uparrow - \vec{I}_\downarrow$ is the difference of currents with spin along and opposite to the spin direction, $\hat{z}$ is the unit vector perpendicular to the interface, $P_{SHE}$ is the spin Hall injection efficiency which is the ratio of magnitude of transverse spin current to lateral charge current, w is the width of the magnet, t is the thickness of the SHE Interconnect 122, $\lambda_{sf}$ is the spin flip length in SHE Interconnect 122, $\theta_{SHE}$ is the spin Hall angle for SHE Interconnect 122 to free ferromagnetic layer interface. The injected spin angular momentum responsible for the spin torque given by:

$$\vec{S} = h\vec{I}_s/2e \quad (2)$$

The spin to charge conversion described with reference to FIGS. 1A-B is based on TMR which is highly limited in the signal strength generated. As such, the TMR based spin to charge conversion has low efficiency (i.e., less than one).

Some embodiments describe a highly efficient transduction method and associated apparatus for converting spin currents to charge currents and then back to spin currents. In some embodiments, Spin Orbit Coupling (e.g., spin Hall effect) is used for transduction from both magnet state to current and back. Spin Orbit Coupling is more efficient switching mechanism for transduction from the magnetization direction to current and for switching magnetization. In some embodiments, charge current via a non-magnetic interconnect carries the signal between input and output magnets rather than spin-polarized current. In some embodiments, the sign of the charge current is determined by the direction of magnetization in the input magnet.

In some embodiments, spin-to-charge conversion is achieved via spin orbit interaction in metallic interfaces (i.e., using Inverse Rashba-Edelstein Effect (IREE) and/or Inverse SHE (ISHE), where a spin current injected from an input magnet produces a charge current.

Table 1 summarizes transduction mechanisms for converting spin current to charge current and charge current to spin current for bulk materials and interfaces.

TABLE 1

Transduction mechanisms for Spin to Charge
and Charge to Spin Conversion using SOC

|  | Charge → Spin | Spin → Charge |
| --- | --- | --- |
| Bulk | Spin Hall Effect | Inverse Spin Hall Effect |
| Interface | Rashba-Edelstein Effect | Inverse Rashba-Edelstein effect |

There are many technical effects of the various embodiments. For example, long distance interconnects are provided which can be used to convey the charge which does not attenuate as spin currents do. This charge is later converted to spin again for logic operations by the spin logic. As such, faster switching speed (e.g., five times faster) and lower witching energy (e.g., 1000 times lower) are observed for signal propagation from the input magnet to the output magnet compared to spin transfer based circuits. Other technical effects will be evident by various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
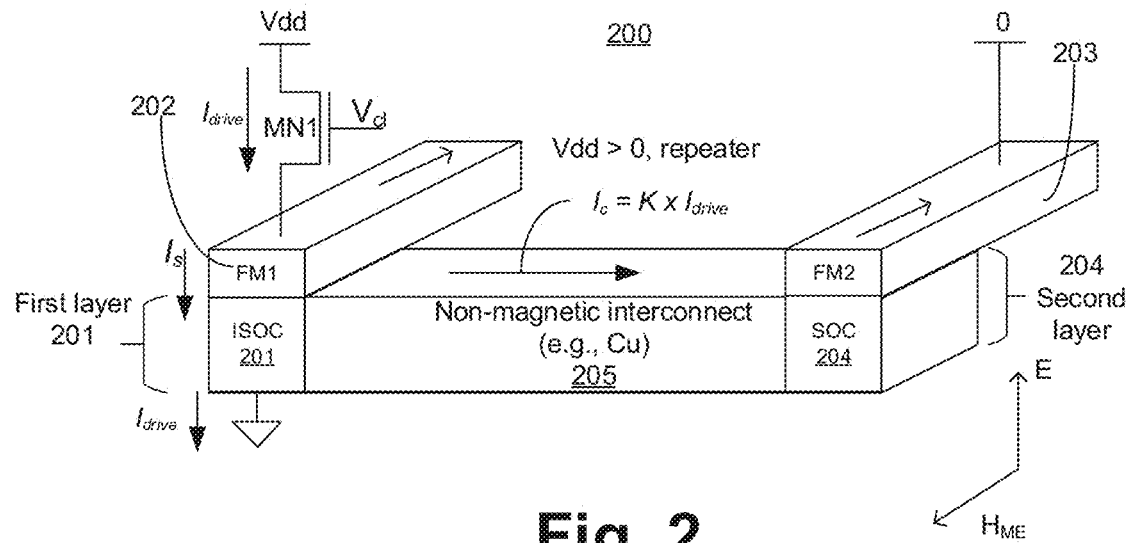
FIG. 2 illustrates Spin Orbit Coupling Logic (SOCL) device implemented as a repeater, according to some embodiments of the disclosure.

FIG. 2 illustrates Spin Orbit Coupling Logic (SOCL) device 200 implemented as a repeater, according to some embodiments of the disclosure. In some embodiments, SOCL device 200 comprises a first terminal (i.e., input terminal) having a first layer 201 coupled to first magnet 202, non-magnetic metal interconnect 205 (e.g., Cu interconnect), second magnet 203, and output layer 204 exhibiting SOC effect or SHE. Here, first magnet 202 is also referred to as the input magnet and second magnet 203 is also referred to as the output magnet. Here, first layer 201 (or input layer 201) and output layer 204 are also referred to as input and output spin Hall electrodes or spin orbit coupling electrodes.

In some embodiments, a transistor MN1 is coupled to first magnet 202 to provide it with a drive current $I_{drive}$ (or charge current) when the clocking voltage $V_{cl}$ (e.g., periodic input voltage) is raised above the transistor threshold voltage. In some embodiments, transistor MN1 is shared among several SOCL devices. Here, the source terminal of transistor MN1 is coupled to first magnet 202 while the drain terminal of MN1 is coupled to a power supply node Vdd. In some embodiments, transistor MN1 can be replaced with a p-type transistor MP1 and associated logic can be adjusted accordingly.

In some embodiments, when transistor MN1 is turned on, $I_{drive}$ is injected into first magnet 202, where it becomes spin polarized current $I_s$. In some embodiments, first layer 201 converts the spin polarized current $I_s$ to corresponding charge current $I_c$, the sign of which is determined by the magnetization direction of first magnet 202.

In some embodiments, first layer 201 comprises layers of materials exhibiting inverse spin orbit coupling (ISOC) such as one of inverse SHE (ISHE) or inverse Rashba-Edelstein effect (IREE). In some embodiments, first layer 201 comprises a stack of layers with materials exhibiting IREE and ISHE effects. In some embodiments, first layer 201 comprises a metal layer, such as a layer of Copper (Cu), Silver (Ag), or Gold (Au), which is coupled to FM1 201. In some embodiments, the metal layer is a non-alloy metal layer.

In some embodiments, first layer 201 acts as the appropriate template for creating the ferromagnet. In some embodiments, first layer 201 also comprises layer(s) of a surface alloy, e.g. Bismuth (Bi) on Ag coupled to the metal layer. In some embodiments, the surface alloy is a templating metal layer to provide a template for forming the ferromagnet. In some embodiments, the metal of the metal layer which is directly coupled to FM1 202 is a noble metal (e.g., Ag, Cu, or Au) doped with other elements for group 4d and/or 5d of the Periodic Table.

In some embodiments, the surface alloy is one of: Bi—Ag, Antimony-Bismuth (Sb—Bi), Sb—Ag, Lead-Nickel (Pb—Ni), Bi—Au, Pb—Ag, Pb—Au, β—Ta; β—W; Pt; or $Bi_2Te_3$. In some embodiments, one of the metals of the surface alloy is an alloy of heavy metal or of materials with high SOC strength, where the SOC strength is directly proportional to the fourth power of the atomic number of the metal.

Here, the crystals of Ag and Bi of first layer 201 have lattice mismatch (i.e., the distance between neighboring atoms of Ag and Bi is different). In some embodiments, the surface alloy is formed with surface corrugation resulting from the lattice mismatch, (i.e., the positions of Bi atoms are offset by varying distance from a plane parallel to a crystal plane of the underlying metal). In some embodiments, the surface alloy is a structure not symmetric relative to the mirror inversion defined by a crystal plane. This inversion asymmetry and/or material properties lead to spin-orbit coupling in electrons near the surface (also referred to as the Rashba effect).

In some embodiments, input and/or output magnets 202 and 203 (i.e., FM1 and FM2), respectively, are free magnets that are made from CFGG (i.e., Cobalt (Co), Iron (Fe), Germanium (Ge), or Gallium (Ga) or a combination of them). In some embodiments, input and/or output magnets 202 and 203, respectively, are free magnets that are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the input nanomagnets FM1 202 are a Heusler alloy lattice matched to Ag (i.e., the Heusler alloy is engineered to have a lattice constant close (e.g., within 3%) to that of Ag). In some embodiments, the direction of the spin polarization is determined by the magnetization direction of input magnet 202. In some embodiments, input and/or output magnets 202 and 203 (i.e., FM1 and FM2), respectively are formed of Heusler alloy, Co, Fe, Ni, Gd, B, Ge, Ga, or a combination of them.

In some embodiments, Heusler alloys that form input and/or output magnets 202 and 203, respectively, are one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, when the spin current $I_s$ flows through the 2D (two dimensional) electron gas between Bi and Ag in first layer 201 with high SOC, charge current $I_c$ is generated. In some embodiments, the interface surface alloy of $BiAg_2/PbAg_2$ of first layer 201 comprises of a high density 2D electron gas with high Rashba SOC. The spin orbit mechanism responsible for spin-to-charge conversion is described by Rashba effect in 2D electron gases. In some embodiments, 2D electron gases are formed between Bi and Ag, and when current flows through the 2D electron gases, it becomes a 2D spin gas because as charge flows, electrons get polarized.

The Hamiltonian energy $H_R$ of the SOC electrons in the 2D electron gas corresponding to the Rashba effect is expressed as:

$$H_R = \alpha_R(k \times \hat{z}) \cdot \vec{\sigma} \quad (3)$$

where $\alpha_R$ is the Rashba coefficient, 'k' is the operator of momentum of electrons, $\hat{z}$ is a unit vector perpendicular to the 2D electron gas, and $\vec{\sigma}$ is the operator of spin of electrons.

The spin polarized electrons with direction of polarization in-plane (in the xy-plane) experience an effective magnetic field dependent on the spin direction which is given as:

$$B(\vec{k}) = \frac{\alpha_R}{\mu_B}(\vec{k} \times \hat{z}) \quad (4)$$

where $\mu_B$ is the Bohr magneton.

This results in the generation of a charge current in the interconnect proportional to the spin current $I_s$. The spin orbit interaction at the Ag/Bi interface (i.e., the Inverse Rashba-Edelstein Effect (IREE)) produces a charge current $I_c$ in the horizontal direction which is expressed as:

$$I_c = \frac{\lambda_{IREE} I_s}{w_m} \quad (5)$$

where $w_m$ is width of the magnet, and $\lambda_{IREE}$ is the IREE constant (with units of length) proportional to $\alpha_R$.

The IREE effect produces spin-to-charge current conversion around 0.1 with existing materials at 10 nm magnet width. For scaled nanomagnets (e.g., 5 nm width) and exploratory SHE materials such as $Bi_2Se_3$, the spin-to-charge conversion efficiency can be between 1 and 2.5, in accordance with some embodiments. The net conversion of the drive charge current $I_d$ to magnetization dependent charge current is:

$$I_c = \pm \frac{\lambda_{IREE} P I_d}{w_m} \quad (6)$$

where P is the spin polarization.

The charge current $I_c$ then propagates through the non-magnetic interconnect 205 coupled to first layer 201, and as such the charge current flows from first terminal 202 (coupled to Vdd) to second terminal 203 (coupled to ground). In some embodiments, charge current $I_c$ conducts through non-magnetic interconnect 205 without loss to another transducer (i.e., second layer 204). The direct SHE from second layer 204 generates a torque on the magnet which is much more efficient per unit charge than spin-transfer torque. Positive charge currents (i.e., currents flowing in the +y direction) produce a spin injection current with transport direction (along the +z direction) and spins pointing to the +x direction in second layer 204. The injected spin current in-turn produces spin torque to align the free output magnet 203 (coupled to the SHE material) in the +x or -x direction.

In some embodiments, second layer 204 is formed of materials that exhibit direct SHE. In some embodiments, second layer 204 is formed of materials that exhibit SOC. In some embodiments, second layer 204 is formed of the same material as first layer 202. In some embodiments, second layer 204 is formed of a different material than first layer 202. In some embodiments, second layer 204 is formed of one or more of: β-Ta, β-W, W, Pt, Cu doped with Iridium, Cu doped with Bismuth, or Cu doped an element of 3d, 4d, 5d, 4f, or 5f of periodic table groups.

In some embodiments, SOCL device 200 is operable to function as a repeater (i.e., buffer). In some embodiments, the injected charge current $I_c$ in interconnect 205 is converted by second layer 204 by SOC or SHE to spin current in FM2 203 such that the effective magnetic field on output magnet 203 aligns its magnetization to be parallel to the magnetization of 202. As such, the direction of $I_c$ is determined by the magnetization of input magnet FM1 202.

Figure 3:
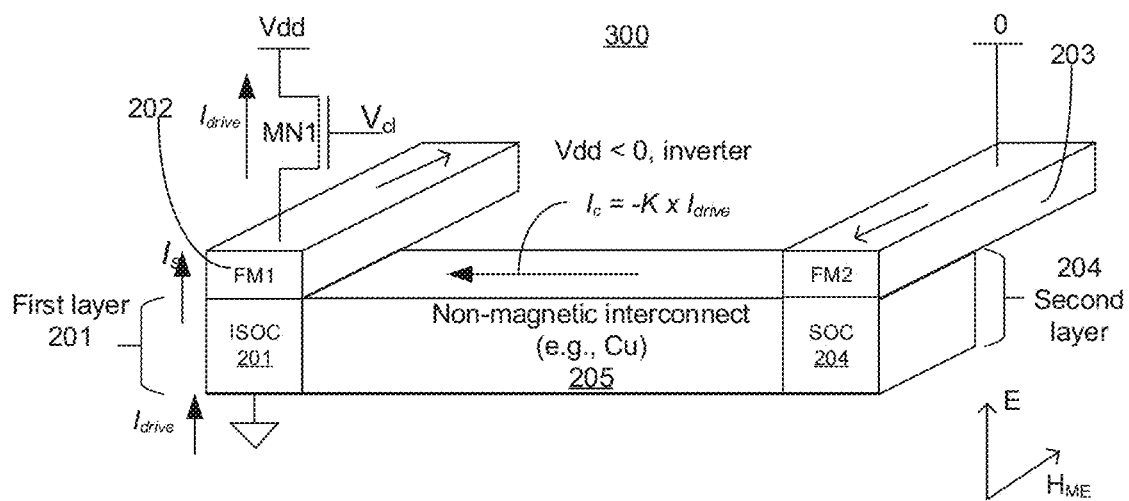
FIG. 3 illustrates a SOCL device implemented as an inverter, according to some embodiments of the disclosure.

FIG. 3 illustrates SOCL device 300 implemented as an inverter, according to some embodiments of the disclosure. It is pointed out that those elements of FIG. 3 having the same reference numbers (or names) as the elements of any other figure can operate or function in any manner similar to that described, but are not limited to such. So as not to obscure the embodiments, differences between FIG. 3 and FIG. 2 are described.

In some embodiments, SOCL device 300 is operable to function as an inverter. In this example, the first terminal above input magnet 202 is coupled to a negative power supply (i.e., -Vdd<0) while the second terminal below magnet 202 is coupled to ground (i.e. 0 V). In this case, the direction of charge current $I_c$ is reversed relative to the charge current $I_c$ in case of FIG. 2. Referring back to FIG. 3, the injected charge current into second layer 204 produces spin current via SOC which in turn produces a large effective magnetic field or spin torques on the output magnet (i.e., second magnet 203) to align its magnetization to be opposite to the magnetization of 202.

The SOCL devices of FIGS. 2-3 exhibit much improvement in energy-delay product (i.e., lower energy and delay) over spin-transfer based devices. The transient spin dynamics and transport of SOCL devices 200/300 can be simulated using vector spin circuit models coupled with nanomagnets dynamics. As such, the operation of SOCL devices 200/300 can be verified using multi-physics simulation which treats the nanomagnets as single magnetic moments and uses spin circuit theory to calculate the scalar voltage and vector spin voltages.

The dynamics of nanomagnets can be described by Landau-Lifshitz-Gilbert (LLG) equations:

$$\frac{\partial m_1}{\partial t} = -\gamma\mu_0[m_1 \times \overline{H}_{eff}] + \alpha\left[m_1 \times \frac{\partial m_1}{\partial t}\right] - \frac{\overline{I}_{s1}}{eN_s}$$

$$\frac{\partial m_2}{\partial t} = -\gamma\mu_0[m_2 \times \overline{H}_{eff}] + \alpha\left[m_2 \times \frac{\partial m_2}{\partial t}\right] - \frac{\overline{I}_{s2}}{eN_s}$$

Here, $\overline{I}_{s1}$ and $\overline{I}_{s2}$ are the projections perpendicular to magnetizations of the spin polarized currents entering the two free nanomagnets—First and Second Free Magnet layers 202 and 203, respectively. These projections are derived from the spin-circuit analysis. The effective magnetic field $\overline{H}_{eff}$ originating from the shape and material anisotropy, and the Gilbert damping constant '$\alpha$' are the properties of the magnets. The spin currents are obtained from a vector transport model for the magnetic stack. Here, $m_1$ and $m_2$ are magnetization vectors of the first and second free magnet layers 202 and 203, respectively, $N_s$ is the number of spins in each of first and second free magnet layers 202 and 203, respectively. In some embodiments, the spin equivalent circuit comprises a tensor spin conduction matrix governed by the present conduction of the magnet. In one embodiment, a self-consistent stochastic solver is used to account for thermal noise of the magnets.

Figure 4:
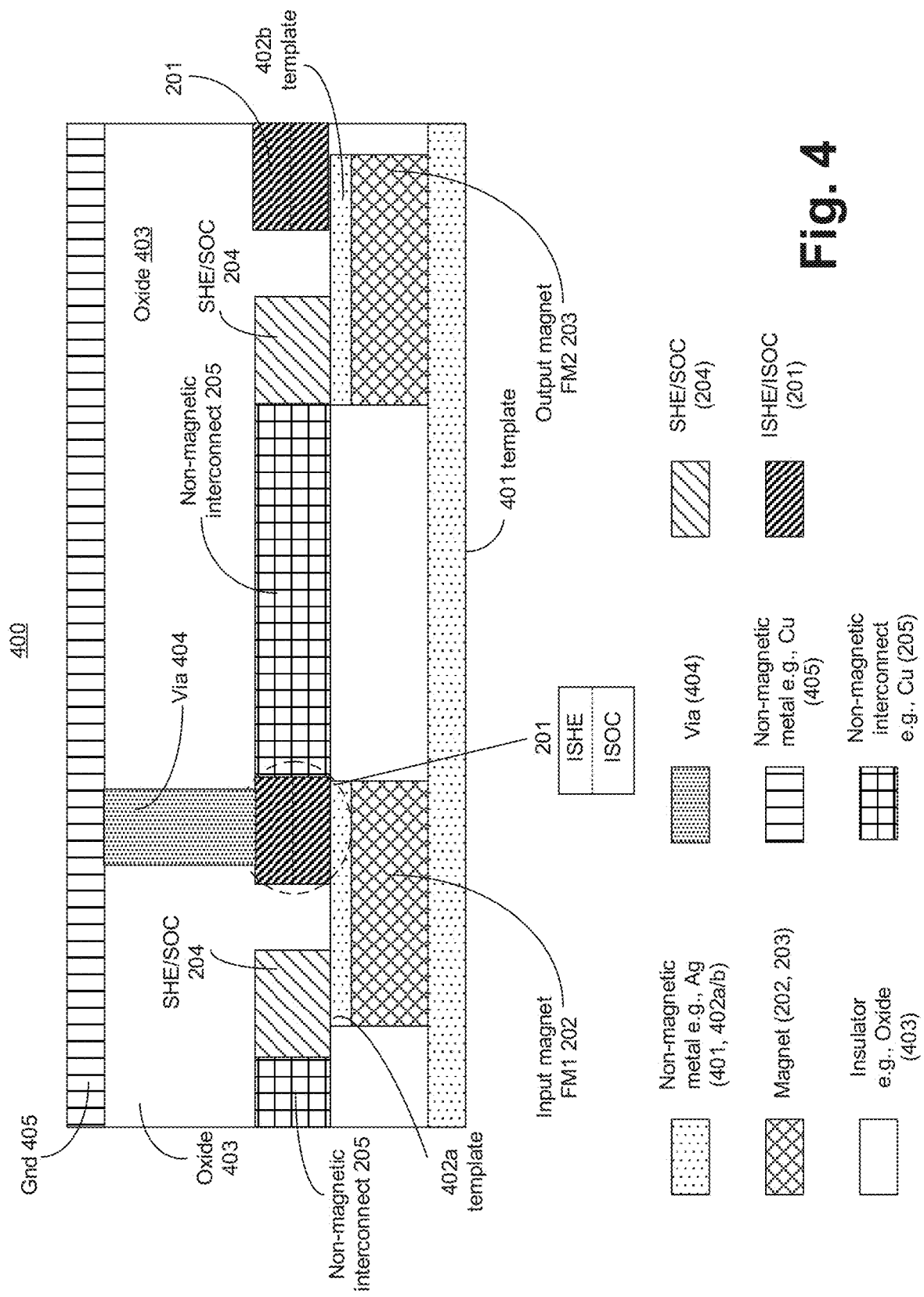
FIG. 4 illustrates a cross-section the SOCL device, according to some embodiments of the disclosure.

FIG. 4 illustrates cross-section 400 of SOCL device 200, according to some embodiments of the disclosure. It is pointed out that those elements of FIG. 4 having the same reference numbers (or names) as the elements of any other figure can operate or function in any manner similar to that described, but are not limited to such.

In some embodiments, cross-section 400 of SOCL device 200 comprises first interface 401 of non-magnetic material (also referred to as the template), first magnet 202, second magnet 203, oxide 403 between first and second Magnets 202/203, respectively, second interface 402a/b over first and second magnets 202/203, respectively, non-magnetic interconnect 205, oxide layer 403 over non-magnetic interconnect 205, Via 404, and second metal layer 405 (e.g., ground layer). Here, interface layers 204a and 204b may be collectively referred to as interface layers 204. First and second magnets 203a/b are also referred to as first and second magnet contacts. First magnet 202 is also referred to as the input magnet while second magnet 203 is also referred to as the output magnet. These labels are provided for purposes of describing the various embodiments, but do not change the structure of SOCL device 200.

In some embodiments, the material(s) used for forming metal layers 405, Via 404, and non-magnetic interconnect 205 is/are the same. For example, Copper (Cu) can be used for forming metal layers 405, Via 404, and non-magnetic interconnect 205. In other embodiments, material(s) used for forming metal layers 405, Via 404, and non-magnetic interconnect 205 are different. For example, metal layer 405 may be formed of Cu while Via 404 may be formed of Tungsten (W). Any suitable metal or combination of metals can be used for forming metal layers 405, Via 404, and non-magnetic interconnect 205.

In some embodiments, engineered interfaces (i.e., first and second interfaces 402a/b and 401, respectively) are formed between the magnets (i.e., first and second magnets 202 and 203, respectively). In some embodiments, first and second interfaces 402a/b and 401, respectively, are formed of non-magnetic material(s) such that the interface layers and the magnets together have sufficiently matched atomistic crystalline layers. For example, the non-magnetic material has a crystal periodicity which is matched through rotation or by mixing of elements.

Here, sufficiently matched atomistic crystalline layers refer to matching of the lattice constant 'a' within a threshold level above which atoms exhibit dislocation which is harmful to the device (i.e., the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from first magnet 202 to first layer 201 increases. Poor matching (i.e., matching worse than 5%) implies dislocation of atoms that is harmful for the device.

In some embodiments, the non-magnetic material for templates 402a/b and 401 is Ag with a crystal lattice constant a=4.05 A which is matched to Heusler alloys CFA (i.e., $Co_2FeAl$) and CFGG (i.e., $Co_2FeGeGa$ with a=5.737 A) provided the direction of the crystal axes is turned by 45 degrees. Then the projection of the lattice constant is expressed as:

$$a\sqrt{2} \approx 5.737A/1.414 \approx 4.057A$$

As such, the magnetic structure stack (e.g., stack of 203 and 402a) allows for interfacial matching of input magnet 202 interfaces with first layer 201 and for interfacial matching of output magnet 204 interfaces with second layer 204. In some embodiments, the stack also allows for templating of the bottom surface of the input and output magnets 202 and 203.

In some embodiments, interface layer 401 (e.g., Ag) provides electrical contact to magnets 202 and 203. As such, a template is provided with the right crystal orientation to seed the formation of the Heusler alloy (which forms input magnet 203). In some embodiments, the directionality of SOC logic may be set by the geometric asymmetry in SOCL device 200.

One technical effect of the engineered interface layers 402a/b (e.g., Ag) between Heusler alloys based magnets 203/204 and first/second layers 201/204 is that it provides for higher mechanical barrier to stop or inhibit the interdiffusion of magnetic species with first and second layers 201/204. In some embodiments, the engineered interface layer(s) 204 maintain high spin injection at the interface between first and second layers 201/204 and magnets 202/203, respectively. As such, engineered interface layer(s) 204 improve the performance of spin device 200, in accordance with some embodiments.

In some embodiments, a layer of oxide 403 is deposited over non-magnetic interconnect 205 and first/second layers 201/204, and then a via hole is etched for Via 404. In some embodiments, Via 404 couples first layer 201 to ground layer 405 which is formed over Oxide layer 403.

In some embodiments, the fabrication of first and second magnets 202/203 and the matching layer is via the use of an in situ processing flow. Here, in situ processing flow refers to a fabricating processing flow that does not break vacuum. As such, oxidation on interfaces 401 and 402a/b are avoided resulting in smooth surfaces at interfaces 401 and 402a/b. In some embodiments, the process of fabricating SOCL device 200 allows for templating of magnets 202/203 (e.g., Heusler alloy based magnets) for appropriate crystal structure.

Figure 5:
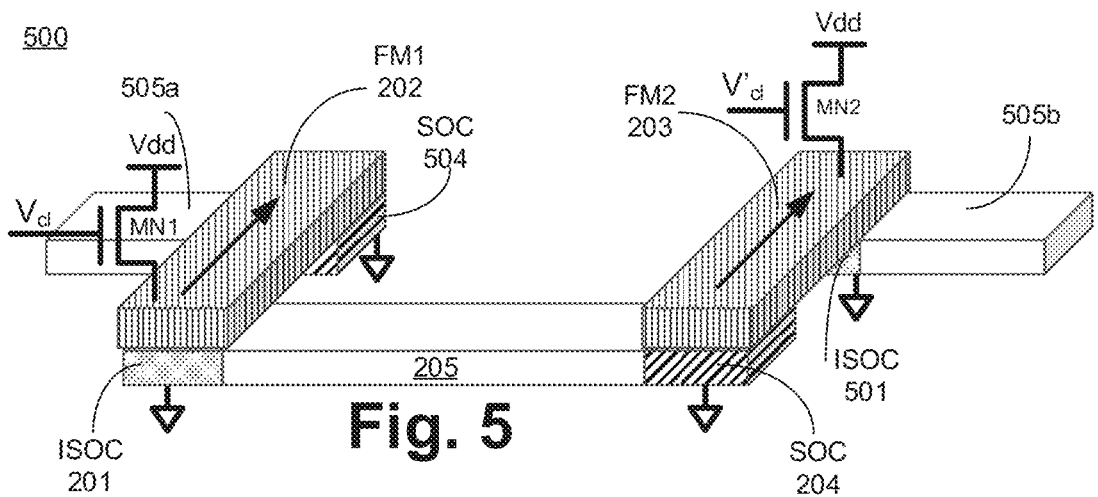
FIG. 5 illustrates a SOCL device with conductors to couple with another device, according to some other embodiments of the disclosure.

FIG. 5 illustrates SOCL device 500 with conductors to couple with another device, according to some other embodiments of the disclosure. It is pointed out that those elements of FIG. 5 having the same reference numbers (or names) as the elements of any other figure can operate or function in any manner similar to that described, but are not limited to such. FIG. 5 is described with reference to FIG. 2. So as not to obscure the embodiments, differences between FIG. 2 and FIG. 5 are described.

In some embodiments, ISOC layer 501 is coupled to another end of FM2 203 while SOC layer 204 is coupled to one end of FM2 203. In some embodiments, ISOC layer 501 is formed of the same material as ISOC layer 201. In some embodiments, ISOC layer 501 is coupled to ground. In some embodiments, non-magnetic conductor 505b is coupled to ISOC layer 501. In some embodiments, non-magnetic conductor 505b is parallel to non-magnetic conductor 205. In some embodiments, non-magnetic conductor 505b is formed of Cu. In other embodiments, other types of non-magnetic conductors may be used. For example, Al may be used instead of Cu. In some embodiments, transistor MN2 is coupled to FM2 203 such that it its source terminal is coupled closer to the end of ISOC layer 501 than to the other end of FM2 203 which is coupled to SOC layer 204. In some embodiments, transistor MN2 is controlled by another clocking voltage $V'_{cl}$ (e.g., periodic input voltage which is an inverse of clocking voltage $V_{cl}$).

In some embodiments, SOC layer 504 is coupled to another end of FM1 202 while ISOC layer 201 is coupled to one end of FM1 202. In some embodiments, SOC layer 504 is formed of the same material as SOC layer 204. In some embodiments, SOC layer 504 is coupled to ground. In some embodiments, a non-magnetic conductor 505a is coupled to SOC layer 504. In some embodiments, non-magnetic conductor 505a is positioned parallel to non-magnetic conductor 205. In some embodiments, non-magnetic conductor 505a is formed of Cu. In other embodiments, other types of non-magnetic conductors may be used. In some embodiments, transistor MN1 is coupled to FM1 202 such that its' source is coupled closer to the end of ISOC layer 201 than to the other end of FM1 202 which is coupled to SOC layer 504.

The position of coupling the source terminals for transistors MN1 and MN2 to the respective FM layers, and the position of ground terminals on SOC layer 504, ISOC 501, ISOC 201, and SOC 204 affects the conduction of spin current. For example, by coupling the source terminals for transistors MN1 and MN2 to the respective FM layers, and the position of ground terminals near the edges (as shown), spin current flows properly through the FM layers. In some embodiments, transistors MN1 and/or MN2 (described with reference to various figures) can be replaced with a p-type transistor(s) and associated logic can be adjusted accordingly.

In some embodiments, SOCL device 500 is operable to couple with other SOCL devices (not shown) through conductors 505a and 505b. In some embodiments, charge current on conductor 505a is converted to spin current by SOC layer 504, and this spin current is then converted to charge current by ISOC layer 201 for transmission over conductor 205. In some embodiments, SOC layer 204 converts the charge current from conductor 205 to spin current. This spin current flows through FM2 203 to the other end of FM2 203. The spin current is then converted to charge current by ISOC 501, in accordance with some embodiments. The charge current is then carried over to another device via conductor 505b.

One reason for coupling ISOC layer 201 and SOC layer 504 to FM1 202 such that ISOC layer 201 and SOC layer 504 are separated from one another is to provide one-way flow of current/charge, in accordance with some embodiments. One-way flow of current/charge ensures that there is no current flowing in a backward direction so as switch the previous magnets (not shown) in the current path.

For example, by adjusting the resistance at one end of FM1 202 relative to the resistance at the other end of FM1 202, current flow path is managed. In this example, an electrical resistivity difference is provided from the SOC 505 side to ISOC 201 side by positioning SOC 505 side to ISOC 201 along ends of FM1 202. The same principal can apply to ISOC 201 and SOC 204 to control the flow of current. For example, an electrical resistivity difference is provided from the ISOC 201 to SOC 204 side to provide one-way path of current/charge flow. The same principal can also be extended to ISOC 501 and SOC 204 to control the flow of current.

In some embodiments, FM layers 202/203 have higher resistance than the resistance of non-magnetic channels (e.g., 100 times more resistance than channel), and that resistance difference provides for one-way current/charge path.

Figure 6A:
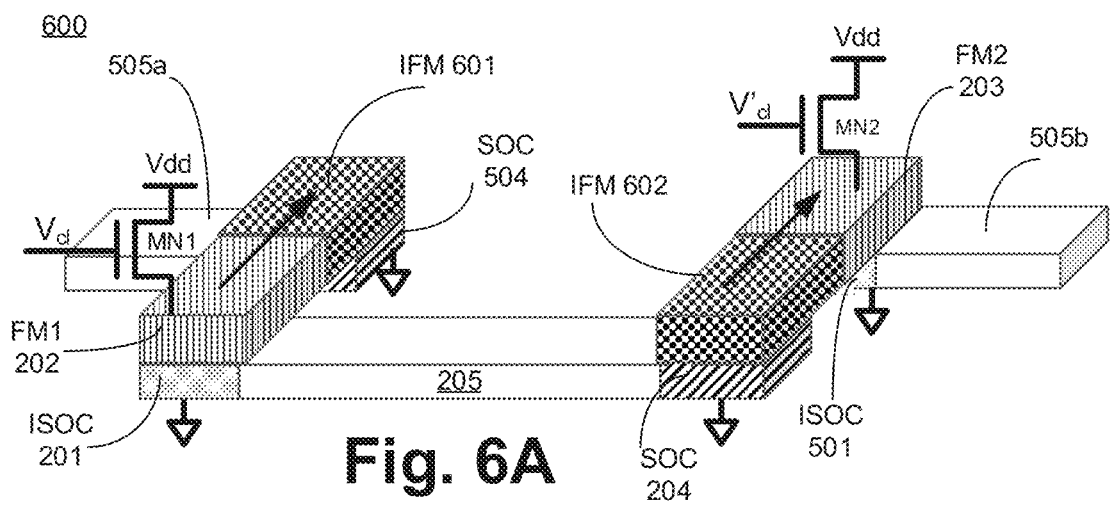
FIGS. 6A-B illustrate SOCL devices with insulating ferromagnet (IFM) and with conductors to couple with another device, according to some embodiments of the disclosure.
Figure 6B:
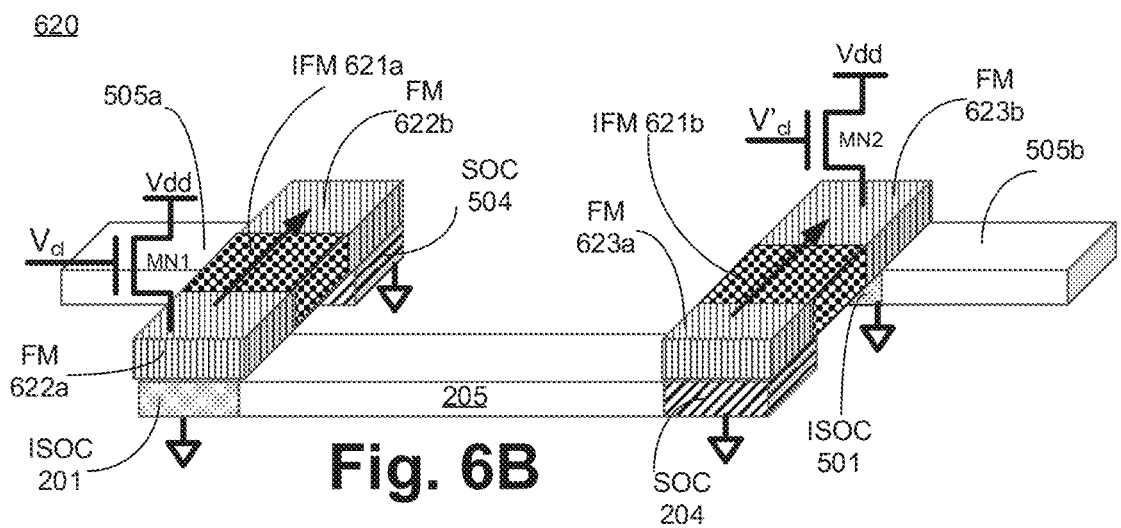

FIGS. 6A-B illustrates SOCL devices 600 and 620 with FM insulators (IFM) and with conductors to couple with another device, according to some embodiments of the disclosure. It is pointed out that those elements of FIGS. 6A-B having the same reference numbers (or names) as the elements of any other figure can operate or function in any manner similar to that described, but are not limited to such. So as not to obscure the embodiments, differences between FIGS. 6A-B, FIG. 2, and FIG. 5 are described.

SOCL device 600 is similar to SOCL device 500 except that insulating ferromagnet IFM 601 is coupled to SOC layer 504 instead of FM1 202, and that insulating FM IFM 602 is coupled to SOC layer 204 instead of FM2 203. Here, IFM 601 is coupled in series with FM1 202, in accordance with some embodiments. Likewise, IFM 602 is coupled in series with FM2 203, in accordance with some embodiments.

In some embodiments, IFM 601/602 are formed by controlled oxidation, implant, or chemical treatment of the ferromagnets FM1 202 and FM2 203, respectively. In some embodiments, IFM 601/602 are formed by flash annealing to reach Garnet annealing temperature of 400° C. to 800° C. locally. In some embodiments, magnetic insulators IFM 601/602 are one of: Yittribium Iron Garnet $Y_3Fe_5O_{12}$, Gadalonium Iron Garnet $Gd_3Ga_5O_{12}$, Terbium Iron Garnet $Tb_3Fe_5O_{12}$, $PbFe_{12}O_{19}$ or $BaFe_{12}O_{19}$.

In some embodiments, the resistivity difference discussed with reference to FIG. 5 is achieved by the magnetic insulators IFM 601/602. For example, IFM 601 causes resistivity difference between the end of the joined magnet near SOC 504 and ISOC 201. As such, current direction is controlled. Here, joined magnet refers to magnet layer formed from a series combination of FM insulator and FM layer. For example, joined magnet coupled to SOC 504 and ISOC 201 is formed from the series combination of IFM 601 and FM1 202. Likewise, IFM 602 causes resistivity difference between the end of the joined magnet (i.e., series combination of IFM 602 and FM2 203) near SOC 204 and ISOC 501. As such, current direction is controlled.

Referring to FIG. 6B, SOCL device 620 is similar to SOCL device 600 except that a first joined magnet is formed from FM 622a, IFM 621a, and FM 622b, and a second joined magnet is formed from FM 623a, IFM 621b, and FM 623b, in accordance with some embodiments. In some embodiments, FM 622a is coupled to ISOC 201, and FM 622b is coupled to SOC 504, while IFM 621a is sandwiched between FM 622a and FM 622b. In some embodiments, FM 623a is coupled to SOC 204, and FM 623b is coupled to ISOC 501, while IFM 621b is sandwiched between FM 623a and FM 623b.

In some embodiments, the resistivity difference discussed with reference to FIG. 5 is achieved by insulating ferromagnets IFM 621a/621b. For example, IFM 621a causes resistivity difference between the ends of the first joined magnet near SOC 504 and ISOC 201 (where, the first joined magnet is formed by the series combination of FM 622a, FM1 621a, and FM 622b). As such, current direction through the first joined magnet is controlled. Likewise, IFM 621b causes resistivity difference between the ends of the second joined magnet (i.e., FM 623a, FM1 621b, and FM 623b) near SOC 204 and ISOC 501. As such, the current direction is controlled through the second joined magnet is controlled.

In some embodiments, IFM 621a/621b are formed by controlled oxidation, implant, or chemical treatment of the ferromagnets FM1 202 and FM2 203. In some embodiments, IFM 621a/621b are formed by flash annealing to reach Garnet annealing temperature of 400° C. to 800° C. locally. In some embodiments, magnetic insulators IFM 621a/621b are one of: Yittribium Iron Garnet $Y_3Fe_5O_{12}$, Gadalonium Iron Garnet $Gd_3Ga_5O_{12}$, Terbium Iron Garnet $Tb_3Fe_5O_{12}$, $PbFe_{12}O_{19}$ or $BaFe_{12}O_{19}$.

In some embodiments, this resistance difference between the non-magnetic conductor and the ferromagnet to control current flow can come from placing the insulating magnet as a separate section of insulating magnet (e.g., by placing IFM layer over FM1 202). In some embodiments, this resistance difference between the non-magnetic conductor and the ferromagnet to control current flow can come from placing the insulating magnet as part of the magnet in contact with SOC/ISOC (such as described with FIG. 6A), or by placing the insulating magnet in the middle of the magnet (such as described with reference to FIG. 6B).

Figure 7A:
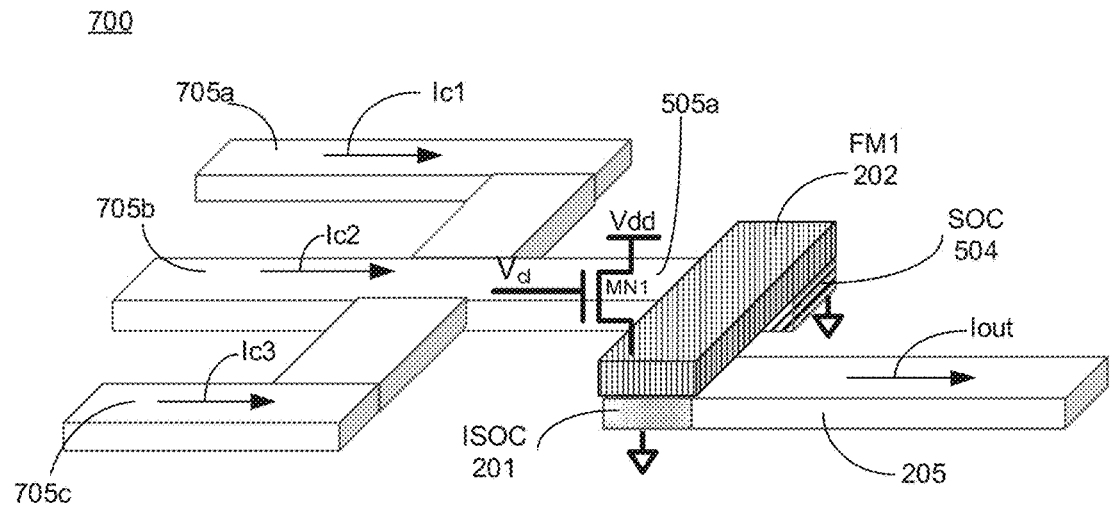
FIGS. 7A-B illustrate majority gate SOCL devices, according to some embodiments of the disclosure.
Figure 7B:
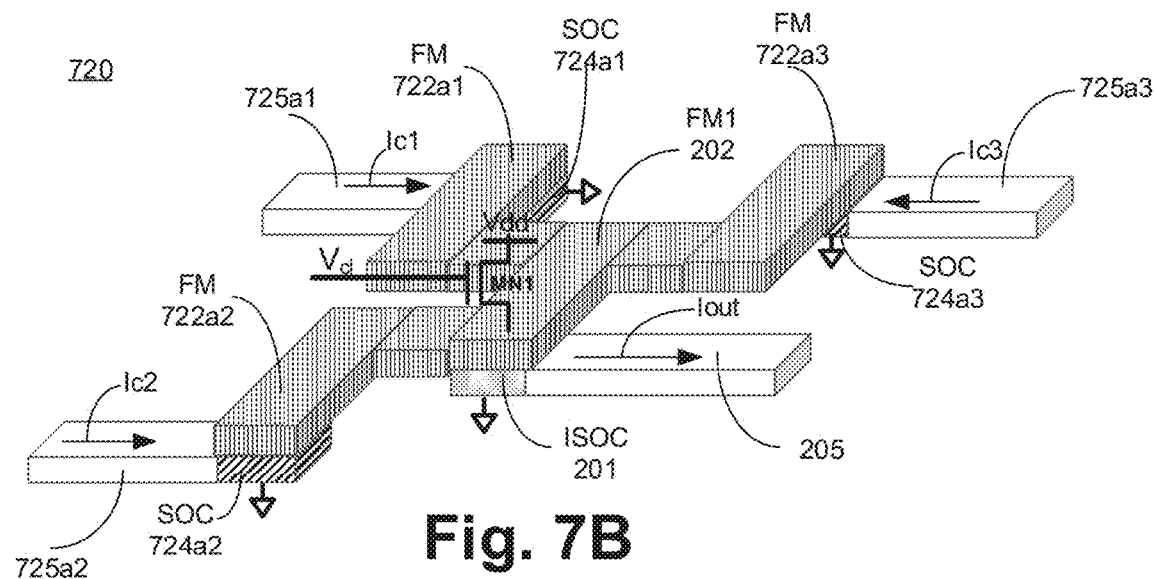

FIGS. 7A-B illustrate majority gates SOCL 700 and 720, according to some embodiments of the disclosure. It is pointed out that those elements of FIGS. 7A-B having the same reference numbers (or names) as the elements of any other figure can operate or function in any manner similar to that described, but are not limited to such. So as not to obscure the embodiments, differences between FIGS. 7A-B and FIG. 2 and FIG. 5 are described.

FIG. 7A shows majority gate SOCL 700 which determines the direction of magnetization on input non-magnetic conductor 505a according to the directions of the majority of charge currents being injected into conductor 505a, in accordance with some embodiments. Depending on the direction of the majority of charge currents on multiple conductors 705a/b/c, a final charge current is formed in conductor 505a having a direction which is the direction of the majority of charge currents. The final charge current on conductor 505a determines the charge current on conductor 205. For example, depending on the directions of Ic1, Ic2, and Ic3, direction of Iout is determined.

FIG. 7A shows majority gate SOCL 720 which determines the direction of charge current Tout on non-magnetic conductor 205 according to the directions of the majority of charge currents Ic1, Ic2, and Ic3 being injected into conductors 725a1, 725a2, and 725a3, in accordance with some embodiments. In some embodiments, charge current Ic1 on non-magnetic conductor 725a1 is converted to spin current by SOC 724a1. This spin current reaches FM1 202 via FM 722a1, in accordance with some embodiments. In some embodiments, charge current Ic2 on non-magnetic conductor 725a2 is converted to spin current by SOC 724a2. This spin current reaches FM1 202 via FM 722a2, in accordance with some embodiments. In some embodiments, charge current Ic3 on non-magnetic conductor 725a3 is converted to spin current by SOC 724a3. This spin current reaches FM1 202 via FM 722a3, in accordance with some embodiments. The current direction of the spin current on FM1 202 is determined by the majority of currents arriving from FM 722a1, 722a2, and 722a3. Accordingly, a final current is provided to non-magnetic conductor 205, in accordance with some embodiments. In some embodiments, materials for FM 722a1, 722a2, and 722a3 are the same as the material(s) for FM1 202.

While the embodiments of FIGS. 7A-B are described with reference to an en-joined FM1 202, the majority gate function also applies when FM1 202 is replaced with joined magnets with insulating ferromagnets described with reference to FIGS. 6A-B.

Figure 8:
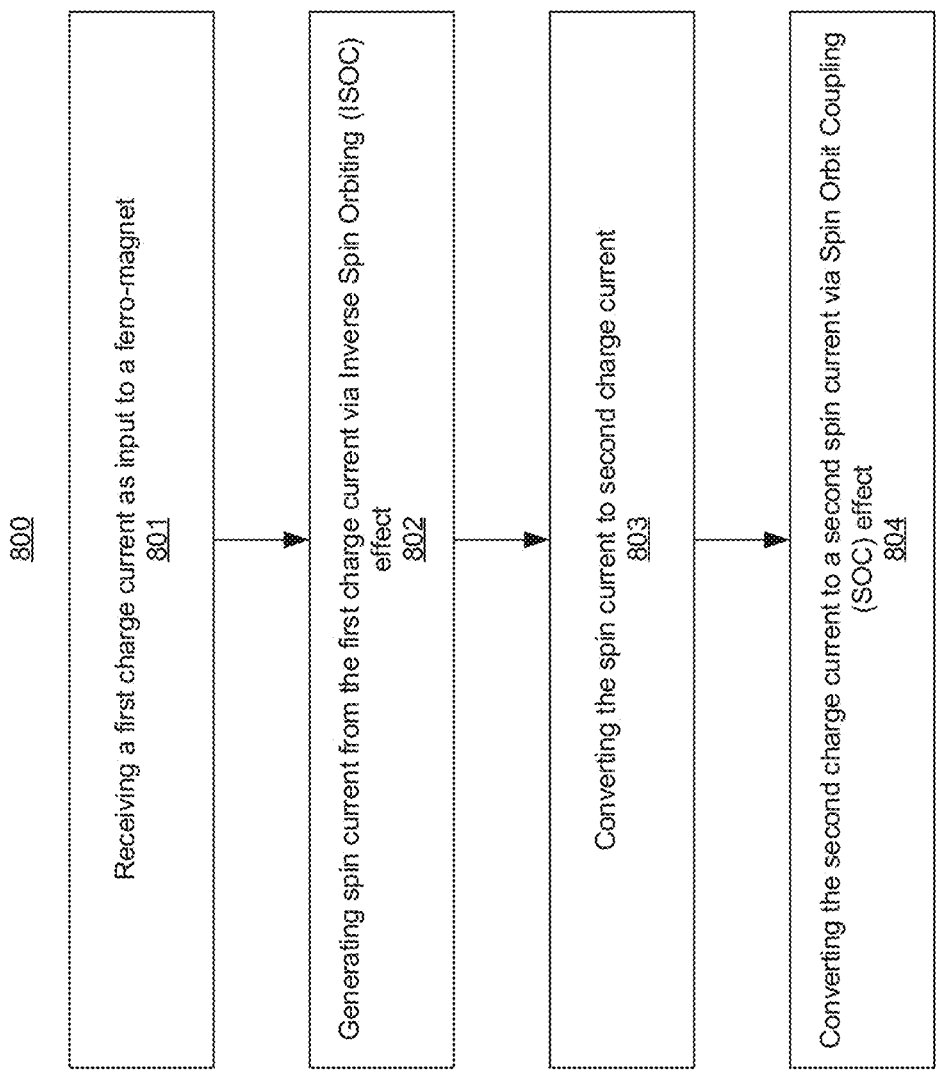
FIG. 8 illustrates a flowchart of a method for converting spin-to-charge and then back to spin current using SOCL device, according to some embodiments of the disclosure.

FIG. 8 illustrates flowchart 800 of a method for converting spin-to-charge and then back to spin current using SOCL, according to some embodiments of the disclosure. It is pointed out that those elements of FIG. 8 having the same reference numbers (or names) as the elements of any other figure can operate or function in any manner similar to that described, but are not limited to such.

Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

While flowchart 800 is described with reference to FIG. 2, the essence of the method applies to other embodiments of SOCL devices such as those described with reference to FIG. 3, FIG. 5, and FIGS. 6A-B.

Referring back to FIG. 8, at block 801, a first charge current $I_c$ is provided as input to input ferromagnet 202. For example, $I_{drive}$ charge current is received by input nanomagnets 202 as described with reference to FIG. 2. Referring back to FIG. 8, at block 802, spin current $I_s$ is generated from the charge current $I_c$ via IREE or ISHE effects provided by first layer 201. At block 803, the spin current $I_s$ is converted to charge current (i.e., second charge current) as the spin current propagates through first layer 201. In some embodiments, the direction of the second charge current depends on the magnetization direction of input magnet 202 coupled first layer 201. This charge current can then be transmitted over longer distances (compared to spin current) using non-magnetic interconnect 205 (e.g., Cu).

At block 804, the second charge current is received by second layer 204 which converts the second charge current into second spin current via direct SOC/SHC effect provided by second layer 204. Positive charge currents (i.e., currents flowing in the +y direction) produce a spin injection current with transport direction (along the +z direction) and spins pointing to the +x direction in second layer 804. The injected spin current in-turn produces spin torque to align the free output magnet 203 (coupled to the SHE material) in the +x or −x direction.

Figure 9:
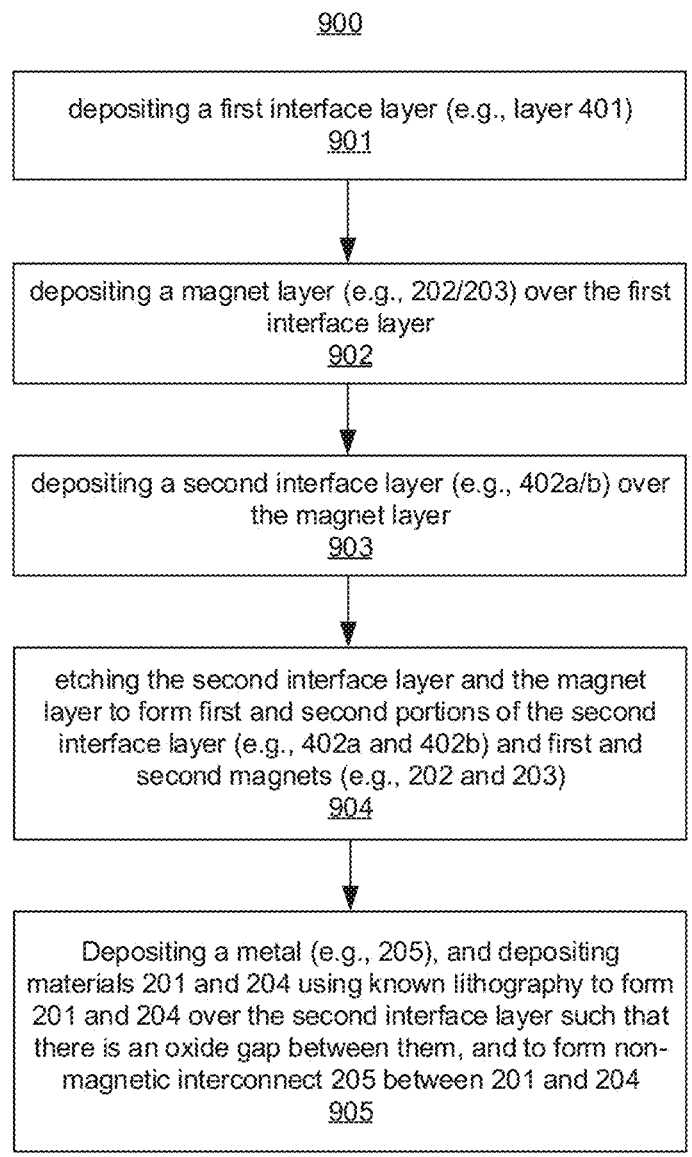
FIG. 9 illustrates a flowchart of a method for fabricating a SOCL device, according to some embodiments of the disclosure.

FIG. 9 illustrates flowchart 900 of a method for fabricating SOCL device 400, according to some embodiments of the disclosure. It is pointed out that those elements of FIG. 9 having the same reference numbers (or names) as the elements of any other figure can operate or function in any manner similar to that described, but are not limited to such.

Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 901, first interface layer 401 is deposited. In some embodiments, first interface layer 401 is formed of a non-magnetic material (e.g., Ag). At block 902, a magnet layer (before being etched to form input and output magnets 202/203) is deposited over first interface layer 401.

At block 903, second interface layer 402 (before being etched to form first and second interface layers 402a/b) is deposited over the magnet layer such that the magnet layer is sandwiched between first and second interface layers 401 and 402. In some embodiments, first and second interface layers 401 and 402, respectively, are formed of non-magnetic material such that the interface layers and magnet layers together have sufficiently matched atomistic crystalline layers.

In some embodiments, the processes of blocks 901, 902, and 903 are performed in situ (i.e., the fabrication processes do not break vacuum). As such oxidization between interfaces of the layers 401, magnet layer (which later forms 202 and 203) and 402a/b is avoided (i.e., smooth interface surfaces are achieved). Smooth interface surfaces allow for higher spin injection efficiency, according to some embodiments.

In some embodiments, the magnet layer is patterned to form first and second magnets 202 and 203. This process breaks vacuum. For example, a photo-resist material is deposited over second interface layer 402 and then etched for forming a patterned photo-resist layer, where the pattern indicates future locations of first and second magnets 202 and 203. At block 904, second interface layer 402 and the magnet layer are selectively etched using the patterned photo-resist to form first and second portions 402a/b of second interface layer 203. As such, first and second magnets 202 and 203 are also formed. In some embodiments, the etching stops above first interface layer 401. The photo-resist material is then removed.

At block 905, known lithography steps are performed to form interconnect 205 (e.g., metal layer), IREE/ISHE exhibiting materials 201, and SOC/SHE exhibiting material 204 such that there is a gap filed with an insulator (e.g., oxide 403) between IREE/ISHE exhibiting materials 201, and SOC/SHE exhibiting material 204. In some embodiments, the method further comprises filing the etched portions with an insulator (e.g., oxide 403). In some embodiments, oxide 403 is etched to form a via hole which is then filled with a metal to form Via 404 such that it couples IREE/ISHE exhibiting materials 201 at one end of Via 404. In some embodiments, metal layer 404 is deposited over oxide 403 to make contact with the other end of Via 404. In some embodiments, second metal layer 201b is coupled to a ground supply.

Figure 10:
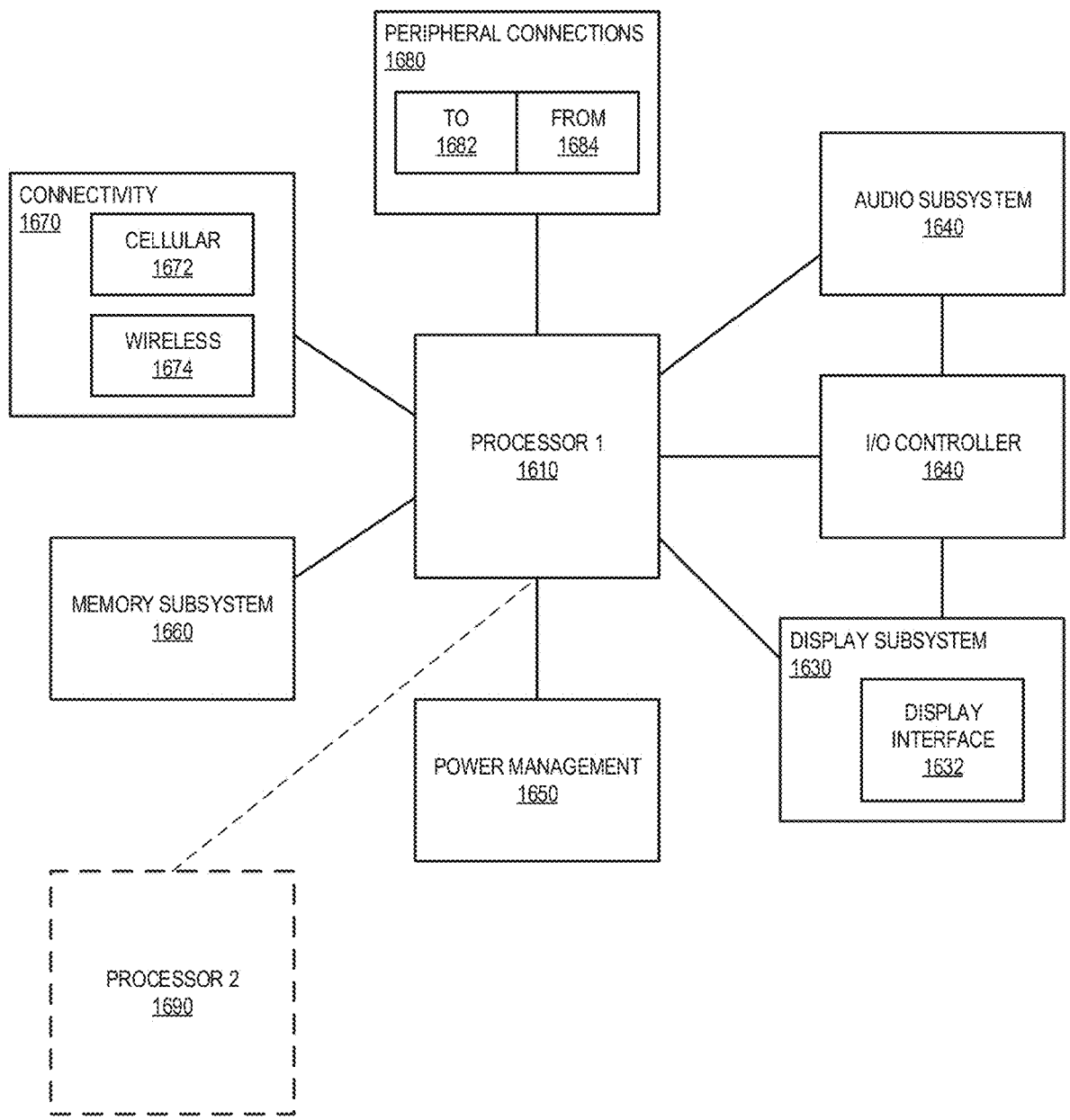
FIG. 10 illustrates a smart device or a computer system or a SoC (System-on-Chip) with an SOCL device, according to some embodiments.

FIG. 10 illustrates a smart device or a computer system or a SoC (System-on-Chip) with SOCL device, according to some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with SOCL device, according to some embodiments discussed. Other blocks of the computing device 1600 may also include SOCL device, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first ferromagnet (FM); a non-magnetic interconnect; a templating metal layer coupled to the first FM; a metal layer coupled to the templating metal layer and to a first end of the non-magnetic interconnect; and a first spin orbit coupling (SOC) layer coupled to a second end of the non-magnetic interconnect. In some embodiments, the first SOC layer is formed of one or more of: β-Ta, β-W, W, Pt, Cu doped with Iridium, Cu doped with Bismuth, or Cu doped with an element of 3d, 4d, 5d, 4f, or 5f of periodic table groups. In some embodiments, the templating metal layer is at least one of: Ag, Cu, or Au.

In some embodiments, the metal layer is at least one of: Bi and Ag; Bi and Au; Bi and Cu; Pb and Ag; Pb and Au; β-Ta; β-W, Pt; or $Bi_2Te_3$. In some embodiments, the apparatus comprises a second FM coupled to the SOC layer. In some embodiments, the first and second FMs are formed of one of: a Heusler alloy, Co, Fe, Ni, Gd, B, Ge, Ga, or a combination of them. In some embodiments, the non-magnetic interconnect is formed of Cu. In some embodiments, the first FM is coupled to an insulating ferromagnet (IFM).

In some embodiments, the IFM is coupled to a second SOC, wherein the second SOC layer is further coupled to a non-magnetic conductor. In some embodiments, the IFM is formed of one of: Yittribium Iron Garnet $Y_3Fe_5O_{12}$, Gadalonium Iron Garnet $Gd_3Ga_5O_{12}$, Terbium Iron Garnet $Tb_3Fe_5O_{12}$, $PbFe_{12}O_{19}$ or $BaFe_{12}O_{19}$. In some embodiments, the second SOC layer is formed of one or more of: β-Ta, β-W, W, Pt, Cu doped with Iridium, Cu doped with Bismuth, or Cu doped with an element of 3d, 4d, 5d, 4f, or 5f of periodic table groups. In some embodiments, the non-magnetic conductor is coupled to at least three other non-magnetic conductors such that the apparatus is operable to perform majority gate function.

In some embodiments, the apparatus comprises: a first ferromagnet (FM); a first spin orbit coupling (SOC) layer coupled at one end of the first FM; a first non-magnetic interconnect coupled to the first SOC layer; a first inverse SOC (ISOC) layer coupled to another end of the first FM; a second non-magnetic interconnect coupled to the ISOC layer; a second SOC layer coupled to the second non-magnetic interconnect; a second magnet having one end coupled to the second SOC layer; a second ISOC layer coupled to another end of the second magnet; and a third non-magnetic interconnect coupled to the second magnet.

In some embodiments, the first ISOC layer is formed of: a templating metal layer coupled to the first FM; and a metal layer coupled to the templating metal layer and to a first end of the second non-magnetic interconnect. In some embodiments, the templating metal layer is at least one of: Ag, Cu, or Au. In some embodiments, the metal layer is at least one of: Bi and Ag; Bi and Au; Bi and Cu; Pb and Ag; Pb and Au; β-Ta; β-W, Pt; or $Bi_2Te_3$. In some embodiments, the first and second SOC layers are formed of one or more of: β-Ta, β-W, W, Pt, Cu doped with Iridium, Cu doped with Bismuth, or Cu doped with an element of 3d, 4d, 5d, 4f, or 5f of periodic table groups. In some embodiments, the first, second, and third non-magnetic interconnects are formed of Cu. In some embodiments, the first and second FMs are formed of one of: a Heusler alloy, Co, Fe, Ni, Gd, B, Ge, Ga, or a combination of them.

In another example, a system is provided which comprises: a memory; a processor coupled to the memory, the processor having an apparatus according to the apparatus described above; and a wireless interface for allowing the processor to communicate with another device.

In another example, an apparatus is provided which comprises: an input ferromagnet to receive a first charge current and to produce a first spin current; a first layer configured to convert the first spin current to a second charge current via spin orbit coupling (SOC), wherein at least a part of the first layer is coupled to the input ferromagnet; and a second layer configured to convert the second charge current to a second spin current via spin orbit coupling (SOC). In some embodiments, the apparatus comprises: an output ferromagnet coupled to the second layer, the output ferromagnet is to receive the second spin current.

In some embodiments, the apparatus comprises: a non-magnetic interconnect coupled at one end to at least part of the first layer, wherein the non-magnetic interconnect is coupled at another end to the second layer. In some embodiments, the first layer comprises a stack of: a templating metal layer which is coupled to the input ferromagnet; and a metal layer coupled to the templating metal layer and the non-magnetic interconnect. In some embodiments, the templating metal layer is formed of at least one of: Ag, Cu, or Au. In some embodiments, the metal layer is formed of at least one of: Bi and Ag; Bi and Au; Bi and Cu; Pb and Ag; Pb and Au; β-Ta; β-W, Pt; or $Bi_2Te_3$.

In some embodiments, the second layer is one or more of: β-Ta, β-W, W, Pt, Cu doped with Iridium, Cu doped with Bismuth, or Cu doped an element of 3d, 4d, 5d, 4f, or 5f of periodic table groups. In some embodiments, the first layer is operable to provide inverse Rashba-Edelstein (IREE) for spin to charge conversion. In some embodiments, the first layer is operable to provide inverse spin Hall effect (ISHE) for spin to charge conversion. In some embodiments, the sign or direction of the second charge current is according to a direction of magnetization of the input ferromagnet.

In some embodiments, the input and output ferromagnets are formed of one of: a Heusler alloy, Co, Fe, Ni, Gd, B, Ge, Ga, or a combination of them. In some embodiments, the input ferromagnet is coupled to an insulating ferromagnet (IFM). In some embodiments, the IFM is coupled to a third layer which provides SOC, wherein the third layer is further coupled to a non-magnetic conductor. In some embodiments, the non-magnetic conductor is coupled to at least three other non-magnetic conductors such that the apparatus is operable to perform majority gate function.

In another example, a system is provided which comprises: a memory; a processor coupled to the memory, the processor having an apparatus according to the apparatus described above; and a wireless interface for allowing the processor to communicate with another device.

In another example, a method is provided which comprises: receiving a first charge current and producing a corresponding first spin current; converting the first spin current to a second charge current via spin orbit coupling (SOC), converting the second charge current to a second spin current via SOC; and receiving the second spin current.

In some embodiments, the first charge current is received by an input ferromagnet, wherein the first spin current is converted to the second charge current by a first layer, wherein at least a part of the first layer is coupled to the input ferromagnet; wherein the second charge current is converted to the second spin current via a second layer, and wherein the second spin current is received by an output ferromagnet coupled to the second layer. In some embodiments, the first layer comprises a stack of: a templating metal layer which is coupled to the input ferromagnet; and a metal layer coupled to the templating metal layer and the non-magnetic interconnect. In some embodiments, the templating metal layer is formed of at least one of: Ag, Cu, or Au. In some embodiments, the metal layer is formed of at least one of: Bi and Ag; Bi and Au; Bi and Cu; Pb and Ag; Pb and Au; β-Ta; β-W, Pt; or $Bi_2Te_3$.

In some embodiments, the second layer is one or more of: β-Ta, β-W, W, Pt, Cu doped with Iridium, Cu doped with Bismuth, or Cu doped an element of 3d, 4d, 5d, 4f, or 5f of periodic table groups. In some embodiments, the first layer is operable to provide inverse Rashba-Edelstein (IREE) for spin to charge conversion. In some embodiments, the first layer is operable to provide inverse spin Hall effect (ISHE) for spin to charge conversion. In some embodiments, the sign or direction of the second charge current is according to a direction of magnetization of the input ferromagnet.

In some embodiments, the input and output ferromagnets are formed of one of: a Heusler alloy, Co, Fe, Ni, Gd, B, Ge, Ga, or a combination of them. In some embodiments, the input ferromagnet is coupled to an insulating ferromagnet (IFM). In some embodiments, the IFM is coupled to a third layer which provides SOC, wherein the third layer is further coupled to a non-magnetic conductor.

In another example, an apparatus is provided which comprises: means for receiving a first charge current and producing a corresponding first spin current; means for converting the first spin current to a second charge current via spin orbit coupling (SOC); means for converting the second charge current to a second spin current via SOC; and means for receiving the second spin current.

In another example, a system is provided which comprises: a memory; a processor coupled to the memory, the processor having an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first magnet;
an interconnect comprising a non-magnetic material;
a first layer comprising metal, the first layer coupled to the first magnet;
a second layer comprising metal, the second layer coupled to the first layer and to a first end of the interconnect;
a third layer comprising a spin orbit (SOC) material, wherein the third layer is coupled to a second end of the interconnect; and
a second magnet coupled to the third layer, wherein the first magnet is coupled to a third magnet, and wherein the third magnet comprises an insulative ferromagnetic material.

2. The apparatus of claim 1, wherein the third layer includes one or more of: β-Ta, β-W, W, Pt, Cu doped with Iridium, Cu doped with Bismuth, or Cu doped with an element of 3d, 4d, 5d, 4f, or 5f of periodic table groups.

3. The apparatus of claim 1, wherein the first layer comprises one of: Ag, Cu, or Au.

4. The apparatus of claim 1, wherein the second layer comprises one or more of: Bi and Ag; Bi and Au; Bi and Cu; Pb and Ag; Pb and Au; β-Ta; β-W, Pt; or $Bi_2Te_3$.

5. The apparatus of claim 1, wherein the first and second magnets include one of: a Heusler alloy, Co, Fe, Ni, Gd, B, Ge, Ga, or a combination of them.

6. The apparatus of claim 1, wherein the interconnect comprises Cu.

7. The apparatus of claim 1, comprises a fourth layer comprising a SOC material, wherein the insulative ferromagnetic material is coupled to the fourth layer, and wherein the fourth layer is coupled to a conductor, and wherein the conductor comprises a non-magnetic material.

8. The apparatus of claim 7, wherein the fourth layer includes one or more of: β-Ta, β-W, W, Pt, Cu doped with Iridium, Cu doped with Bismuth, or Cu doped with an element of 3d, 4d, 5d, 4f, or 5f of periodic table groups.

9. The apparatus of claim 7, wherein the conductor is coupled to at least three other conductors such that the apparatus is operable to perform majority gate function, and wherein the at least three other conductors comprise non-magnetic material.

10. The apparatus of claim 1, wherein the insulative ferromagnetic material includes one of: Y, Fe, O, Gd, Ga, Tb, Pb, or Ba.

11. An apparatus comprising:
a first magnet;
a first layer comprising spin orbit (SOC) material, wherein the first layer is coupled at one end of the first magnet;
a first interconnect coupled to the first layer, wherein the first interconnect comprises a non-magnetic material;
a second layer comprising an inverse SOC material, wherein the second layer is coupled to another end of the first magnet;
a second interconnect comprising a non-magnetic material, wherein the second interconnect is coupled to the second layer;
a third layer coupled to the second interconnect, wherein the third layer comprises SOC material;
a second magnet having one end coupled to the third layer;

a fourth layer comprising an inverse SOC material, wherein the fourth layer is coupled to another end of the second magnet; and a third interconnect coupled to the second magnet, wherein the third interconnect comprises a non-magnetic material.

12. The apparatus of claim 11, wherein the second layer includes:

a fifth layer coupled to the first magnet, wherein the fifth layer comprises a template metal; and a sixth layer comprising metal, wherein the sixth layer is coupled to the fifth layer and to a first end of the second interconnect.

13. The apparatus of claim 12, wherein the fifth layer includes one of: Ag, Cu, or Au.

14. The apparatus of claim 12, wherein the sixth layer includes at least one of: Bi and Ag; Bi and Au; Bi and Cu; Pb and Ag; Pb and Au; β-Ta; β-W, Pt; or $Bi_2Te_3$.

15. The apparatus of claim 11, wherein the first and third layers includes one or more of: β-Ta, β-W, W, Pt, Cu doped with Iridium, Cu doped with Bismuth, or Cu doped with an element of 3d, 4d, 5d, 4f, or 5f of periodic table groups.

16. The apparatus of claim 11, wherein the first, second, and third interconnects includes Cu, and wherein the first and second magnets includes one or more of: a Heusler alloy, Co, Fe, Ni, Gd, B, Ge, Ga, or a combination of them.

17. A system comprising:

a memory;

a processor coupled to the memory, the processor having an apparatus which comprises:

a magnet having a first end and a second end opposite to the first end;

a first structure comprising spin orbit material, wherein the first structure is adjacent to a first end of the magnet;

a first layer comprising non-magnetic metal, the first layer coupled to the first structure;

a second structure comprising inverse spin orbit material, wherein the second structure is adjacent to a second end of the magnet;

a second layer comprising non-magnetic metal, the second layer coupled to the second structure; and a wireless interface to allow the processor to communicate with another device.

18. The system of claim 17, wherein the spin orbit material includes one or more of: β-Ta, β-W, W, Pt, Cu doped with Iridium, Cu doped with Bismuth, or Cu doped with an element of 3d, 4d, 5d, 4f, or 5f of periodic table group, and wherein the first layer includes one of: Ag, Cu, or Au.

* * * * *